(12) United States Patent  
Kawakami et al.

(10) Patent No.: US 6,470,824 B2  
(45) Date of Patent: Oct. 29, 2002

(54) SEMICONDUCTOR MANUFACTURING APPARATUS

(75) Inventors: Satoru Kawakami, Sagamihara (JP); Shigemi Murakawa, Sakura (JP); Mitsuhiro Yuasa, Suginami-ku (JP); Toshiaki Hongoh, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/123,485

(22) Filed: Apr. 17, 2002

(65) Prior Publication Data

US 2002/0111000 A1 Aug. 15, 2002

Related U.S. Application Data

(62) Division of application No. 09/521,601, filed on Mar. 9, 2000, now Pat. No. 6,399,520.

(30) Foreign Application Priority Data

Mar. 10, 1999 (JP) .............................................. 11-63455  
Apr. 5, 1999 (JP) .............................................. 11-97831

(51) Int. Cl.[7] .............................................. C23C 16/00
(52) U.S. Cl. .............................. 118/723 AN; 118/719; 118/723 R; 118/723 MW
(58) Field of Search .................. 118/723 AN, 719, 118/723 R, 723 MW; 438/778, 788, 792

(56) References Cited

U.S. PATENT DOCUMENTS

| 5,587,344 | A | 12/1996 | Ishikawa | 438/790 |
| 6,143,683 | A | 11/2000 | Jang et al. | 437/238 |
| 6,155,199 | A | * 12/2000 | Chen et al. | 118/723 I |
| 6,217,724 | B1 | * 4/2001 | Chu et al. | 204/192.37 |
| 6,338,313 | B1 | * 1/2002 | Chan | 118/723 I |
| 6,341,574 | B1 | * 1/2002 | Bailey et al. | 118/723 I |
| 6,399,520 | B1 | * 6/2002 | Kawakami et al. | 438/778 |

FOREIGN PATENT DOCUMENTS

| JP | 55-134937 | 10/1980 |
| JP | 59-4059 | 1/1984 |
| JP | 5-36899 | 2/1993 |
| JP | 6-61470 | 3/1994 |
| JP | 9-50996 | 2/1997 |
| JP | 312815 | 8/1997 |
| JP | 10-178159 | 6/1998 |

OTHER PUBLICATIONS

Hirayama et al., "New Era of Semiconductor Manufacturing," Ultra Clean Technology, vol. 10, Supplement 1, 1998, pp. 1–52, published by Ultra Clean Society.

* cited by examiner

*Primary Examiner*—Alexander Ghyka  
(74) *Attorney, Agent, or Firm*—Pillsbury Winthrop LLP

(57) ABSTRACT

In an atmosphere of processing gas, on a wafer W consisting mainly of silicon, through a planar-array antenna RLSA 60 having a plurality of slits, microwaves are irradiated to generate plasma containing oxygen, or nitrogen, or oxygen and nitrogen and to implement therewith on the surface of the wafer W direct oxidizing, nitriding, or oxy-nitriding to deposit an insulator film 2 of a thickness of 1 nm or less in terms of oxide film. A manufacturing method to and apparatus of semiconductors that can successfully regulate film quality of the interface between a silicon substrate and a SiN film and can form SiN film of high quality in a short time can be obtained.

3 Claims, 11 Drawing Sheets

FIG. 8

| | THE PRESENT INVERTION | RLSA PLASMA FILM DIRECT NITRIDE FILM | RLSA PLASMA CVD NITRIDE FILM | THERMAL OXIDE FILM |
|---|---|---|---|---|
| LAYER THICKNESS (nm) | 2/1 | 3 | 3 | 3 |
| INSULATION RESISTANCE (MV/cm) | 17 | 17 | 15 | 12 |
| GATE LEAKE CURRENT (A/cm$^2$) 7.5MV/cm | $1 \times 10^{-5}$ | $5 \times 10^{-5}$ | $1 \times 10^{-5}$ | $1 \times 10^{-3}$ |
| INTERFACE STATE (l/cm$^2$/eV) | $6 \times 10^{10}$ | $2 \times 10^{11}$ | $5 \times 10^{11}$ | $6 \times 10^{10}$ |
| PMOS-FET(V) THRESHOLD VOLTAGE CHANGE $\Delta Vth=Vth(BF_2^+)-Vth(B^+)$ | 0 | 0 | 0 | 0.3 |

FIG. 9

|  | THE PRESENT INVENTION | RLSA PLASMA DIRECT NITRIDING PROCESS | RLSA PLASMA CVD PROCESS |
|---|---|---|---|
| FILM THICKNESS (nm) | 2/1 | 3 | 3 |
| TIME (sec) | 30/30 | 245 | 46 |

FIG. 14

| Xe GAS CONTENT | ELECTRIC PROPERTY |
|---|---|
| 30 | × |
| 40 | △ |
| 50 | ○ |
| 60 | ○ |
| 70 | ○ |
| 80 | ○ |
| 90 | ○ |
| 95 | ○ |
| 99 | ○ |

SEMICONDUCTOR MANUFACTURING APPARATUS

This is a divisional application of U.S. Application Ser. No. 09/521,601, which was filed on Mar. 9, 2000 now U.S. Pat. No. 6,399,520, the contents of which are incorporated in its entirety by reference.

BACKGROUND OF THE INVENTION

1. Field of the Invention

The present invention relates to a manufacturing method of semiconductors, in particular detail, to a method for forming gate insulators in MIS (MOS) semiconductor devices, and to a manufacturing method of semiconductor devices provided with insulator films such as gate insulators on a surface of a silicon substrate.

2. Description of the Related Art

Recently, as MIS (MOS) semiconductors have been patterned finer, extremely thin gate insulators such as approximately 4 nm or less are in demand. So far, for gate insulator material, silicon oxide films ($SiO_2$ film) have been industrially used that can be obtained by directly oxidizing a silicon substrate by use of a high temperature furnace of approximately 850° C. to 1000° C.

However, when the $SiO_2$ layer is 4 µm or less, a leakage current (gate leakage current) flowing the gate insulator increases to cause problems such as an increase of consumption power or an acceleration of deterioration of device property.

In addition, there is such a problem that during formation of a gate electrode, boron contained therein causes alloy spikes in the $SiO_2$ film to reach the silicon substrate to result in deterioration of semiconductor device property. As one method for solving such a problem, nitride film (SiN film) is under consideration as the gate insulator material.

When the SiN films are deposited by use of CVD method, there occur many incomplete bonds (dangling bond) at the interface with the silicon substrate to result in deterioration of device property. Accordingly, in forming the SiN films, it is considered very promising to directly nitride a silicon substrate by use of plasma. The reason why to nitride directly is to obtain gate insulators of high quality that are less in interface states.

In addition, one reason for using the plasma is to form SiN films at low temperatures. In obtaining SiN films by heating to nitride, high temperatures of 1000° C. or more are necessary. In the process of the heating, dopant is injected into the silicon substrate. The dopant diffuses differentially to cause deterioration of device property. Such methods are disclosed in Japanese Patent Laid-open Application (KOKAI) Nos. SHO 55-134937 and SHO 59-4059.

However, in the case of depositing SiN layers with the plasma, the following problems have been pointed out. That is, ions in the plasma are accelerated by a plasma sheath voltage to bombard the silicon substrate with high energy, thereby so-called plasma damage occurs at interfaces of the silicon substrate or on the silicon substrate to deteriorate the device property.

To this end, a microwave plasma device is disclosed that is provided with a planar-array antenna that is low in electron temperature and has a lot of slits causing less plasma damage.

(Ultra Clean Technology Vol.10 Supplement 1, p.32, 1998, published by Ultra Clean Society).

In this plasma device, the electron temperature is approximately 1 eV or less and the plasma sheath voltage also is several volts or less. Thus, compared with existing plasma. of which plasma sheath voltage is approximately 50 V, the plasma damage can be largely reduced.

However, even when silicon nitride is formed with this plasma device, in the case of forming SiN films by use of direct nitriding method, there is the following problem. That is, in order to obtain interfaces of. good quality of less dangling bond defects by dominantly distributing oxygen only at the interfaces of the silicon substrate, there is a difficulty in regulating film quality at the interfaces with the silicon substrate.

In addition, in employing this plasma device to nitride, nitrogen atoms must diffuse into the silicon substrate to proceed nitriding. That is a slow process to require a long time to give prescribed processing to an object being processed. Accordingly, the objects can not be processed much per unit period to cause difficulties in industrial application. In forming SiN films of a thickness of for instance 4 nm, even under the best adjusted plasma conditions of such as pressure and microwave power, it takes approximately 5 min or more to process. Accordingly, throughput is much lower than that required from a viewpoint of mass-production, for instance 1 min per one piece of the object.

SUMMARY OF THE INVENTION

The present invention is made to solve the aforementioned problems. That is, an object of the present invention is to provide a method and an apparatus for manufacturing semiconductors that can successfully regulate film quality at the interfaces between silicon substrates and SiN films.

The other object of the present invention is to provide a method and an apparatus for manufacturing semiconductors that can form a SiN film of high quality in a short time.

To the above ends, a manufacturing method of semiconductors of the present invention is characterized in implementing the invention in the following manner. That is, in an atmosphere of processing gas, microwaves are irradiated through a planar-array antenna having a plurality of slits on an object to be processed comprising silicon to generate plasma containing oxygen, or nitrogen, or oxygen and nitrogen. With the plasma, direct oxidation, nitriding, or oxy-nitriding is implemented on a surface of the object to form an insulator film of a thickness of 1 nm or less (in terms of silicon oxide film).

In the present manufacturing method, a thickness of insulator film is 1 nm or less. Accordingly, the nitriding of the silicon substrate is not due to diffusion but due mainly to a reaction process between nitrogen atoms or oxygen atoms or nitrogen and oxygen atoms generated by the plasma and the surface of silicon substrate. As a result of this, a nitriding rate of such short as approximately 30 sec can be obtained. on the thin insulator film that is obtained by implementing the direct nitriding or oxidizing or oxy-nitriding, the rest of the insulator film is deposited by use of CVD method. In this case, since a deposition rate of 3 nm/min or more can be attained relatively easily, even an insulator film of a total film thickness of 4 nm can be formed in less than two min.

In addition, in the present manufacturing method, a process for forming, due to direct nitriding or oxidizing or oxy-nitriding, an insulator film of good quality at an interface with the silicon substrate and a process for forming thereon, due to CVD method, the rest of the insulator film can be independently implemented. Accordingly, compared with the case where all process is implemented by direct nitriding only or CVD method only to form an insulator film, the film quality at the interface with the silicon substrate can be improved in regulation to result in an insulator film of better quality.

In the present manufacturing method, for the processing gases, a gas containing for instance $N_2$ or $N_2O$ or $NO$ or $NH_3$ can be cited. The processing gas can contain rare gas such as argon or the like.

Another manufacturing method of semiconductors of the present invention comprises a step of forming a first insulator film and a step of forming thereon a second insulator film. Here, the step of forming the first insulator is carried out in the following manner. That is, in an atmosphere of a processing gas, on an object to be processed comprising silicon, through a planar-array antenna having a plurality of slits, microwaves are irradiated to generate plasma containing oxygen, or nitrogen, or oxygen and nitrogen. With the plasma, direct oxidizing, nitriding, or oxy-nitriding is implemented to form the first insulator film.

In the aforementioned manufacturing method, the second insulator film can be an insulator film comprising for a instance silicon nitride.

The process of forming the second insulator film may be implemented by use of CVD method, or by use of plasma irradiation.

Plasma containing for instance $N_2$ or $NH_3$ and monosilane or dichlorosilane or trichlorosilane is supplied to form the second insulator film.

According to the present method, in an atmosphere of a processing gas, on an object to be processed consisting mainly of silicon, microwaves are irradiated through a planar-array antenna having a plurality of slits, so-called RLSA (Radial Line Slot Antenna) antenna. Thereby, the plasma is directly supplied on the silicon substrate to form a SiN insulator film. Accordingly, film quality at the interface with SiN insulator film formed on a surface of the silicon substrate can be successfully regulated.

Furthermore, according to another manufacturing method of the present invention, on a first insulator film formed by use of so-called RLSA antenna, all the second insulator film can be formed by irradiation of the plasma of low damage. As a result of this, a SiN film of high quality can be formed. In particular, when the second insulator film is formed by use of the CVD method, the insulator film can be deposited in a short time to result in formation of a SiN film of high equality in a short time.

In addition, in a silicon semiconductor device, so far, as a gate insulator, silicon oxide film ($SiO_2$ film) has been used. However, when a thickness of $SiO_2$ film is made thinner than 60 angstroms that is a thickness being employed now, there is a lower limit at 40 angstroms. When tried to make thinner than this, a leakage current becomes larger to result in larger power consumption. This is impractical.

Therefore, a silicon nitride film (SiN film) that does not cause a large leakage current when thinning down to approximate 40 angstroms is being considered to use as a gate insulator.

For instance, Japanese Patent Laid-open Application (KOKAI) Nos. HEI 5-36899 and HEI 9-50996 disclose an example of stacking a silicon nitride film due to thermal nitriding and silicon nitride film due to vapor phase growth method. In an example disclosed in HEI 5-36899, polycrystalline silicon is patterned in a prescribed shape to form an electrode, followed by fast thermal nitriding at 850° C. for 60 sec with an annealing furnace to form a silicon nitride film of a film thickness of approximate several nm on a surface of the electrode due to thermal nitriding. On the surface of this silicon nitride film, a silicon nitride film of approximately 4 nm is deposited due to low-pressure vapor phase growth method.

In Japanese Patent Laid-open Application (KOKAI) No. HEI 6-61470, an example employing a silicon oxynitride film is disclosed. In this example, silicon oxide film is annealed in an atmosphere of $NH_3$ at 900 to 1000° C. for approximately 10 min to 1 hour to form silicon oxynitride film.

Furthermore, in Japanese Patent Laid-open Application (KOKAI) No. HEI 10-178159, an example of a combination of three layers of silicon oxynitride film, silicon nitride film, and silicon oxynitride film is disclosed. In this example, silicon oxynitride film is formed in the following way. In a low pressure CVD device, from monosilane and nitrous oxide, high temperature silicon oxide film is formed under conditions of a pressure of approximately 50 Pa and a temperature of 700 to 850° C. Then, at a temperature of 700 to 850° C., nitrous oxide is introduced to transform the high temperature silicon oxide film to silicon oxynitride film. On the other hand, the silicon nitride film is formed in a low pressure CVD device from dichlorosilane and ammonia at a temperature of 700 to 850° C.

However, silicon nitride film due to thermal nitriding has a lot of dangling bonds (free species) and is poor in electrical properties. Silicon nitride film (silicon nitride film) due to low-pressure vapor phase growth method also is poor in electrical properties. In addition, silicon oxynitride film takes a long time to form.

The present inventors used high-density plasma to generate plasma from a mixture of argon gas and nitrogen gas and hydrogen gas to form therewith SiN film by nitriding a surface of a silicon substrate. Although SiN film of excellent electrical property can be obtained by this means, there is a disadvantage that SiN film can not be formed with a high rate.

The present invention is made under such circumstances. An object is to provide a method for manufacturing semiconductor devices provided with an insulator film of excellent electrical property and of higher deposition rate.

A method for producing semiconductor devices of the present invention comprises a step of forming a first silicon nitride film and a step of forming a second silicon nitride film of larger deposition rate than that of the first silicon nitride film. Here, the first silicon nitride film is formed by nitriding a surface of a silicon substrate with plasma. The plasma is obtained from a gas mixture containing rare gas and nitrogen and hydrogen or rare gas and ammonia but not silicon and containing 50% and more and 99% or less of rare gas. The second silicon nitride film is formed on the surface of the first silicon nitride film with plasma, the plasma being obtained from a gas mixture containing rare gas and nitrogen and silicon and containing 50% or more and 99% or less of rare gas. At this time, it is preferable to generate the plasma with high frequency power of 300 MHz or more and 2500 MHz or less.

In a manufacturing method of semiconductor devices of the present invention, insulator film formed at the interface of a silicon substrate is silicon oxide film. The silicon oxide film may be formed by oxidizing a surface of the silicon substrate with plasma or without plasma, the plasma being obtained from a gas mixture containing rare gas and oxygen but not silicon and containing 50% or more and 99% or less of rare gas. Further, an insulator film formed at the interface of the silicon substrate may be silicon oxynitride film.

BRIEF DESCRIPTION OF DRAWINGS

FIG. 8 is a diagram showing comparison between various deposition conditions and quality performance of gate insulators obtained under the various deposition conditions.

FIG. 9 is a diagram showing relationship between deposition time and film thickness in various deposition methods.

FIG. 14 is a characteristic diagram showing relationship between amount of Xe gas and electrical property.

DESCRIPTION OF PREFERRED EMBODIMENTS (A First Mode of Implementation)

In the following, one mode of implementation of the present invention will be explained.

First, an example of a structure of a semiconductor device that is manufactured due to a manufacturing method of semiconductors of the present invention will be explained with a semiconductor device provided with gate insulator as insulator film as an example with reference to FIG. 1.

Figure 1A:
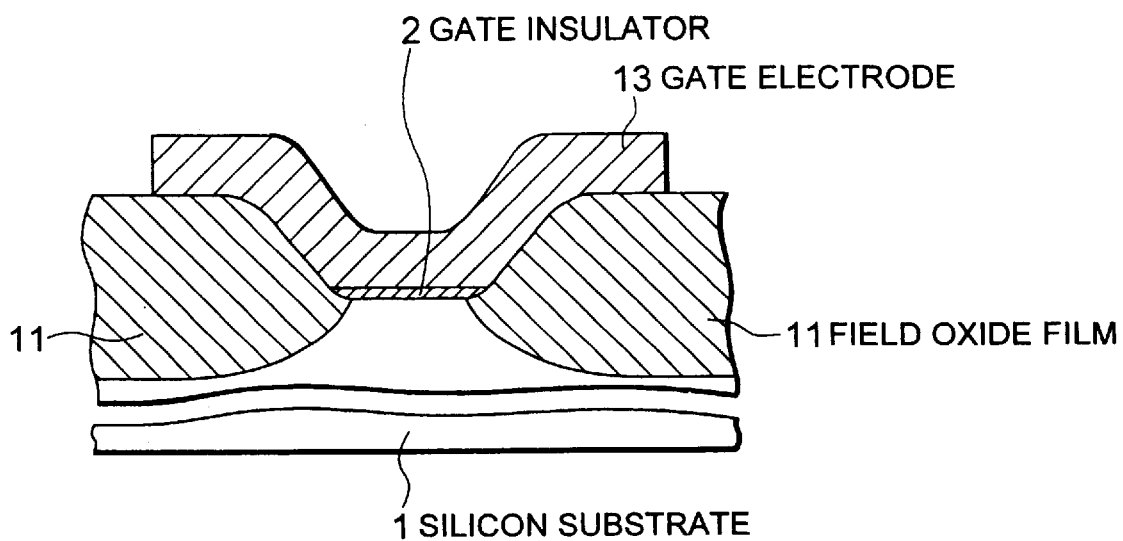
FIG. 1 is a vertical sectional view of a semiconductor device manufactured due to a manufacturing method of semiconductors of the present invention.
Figure 1B:
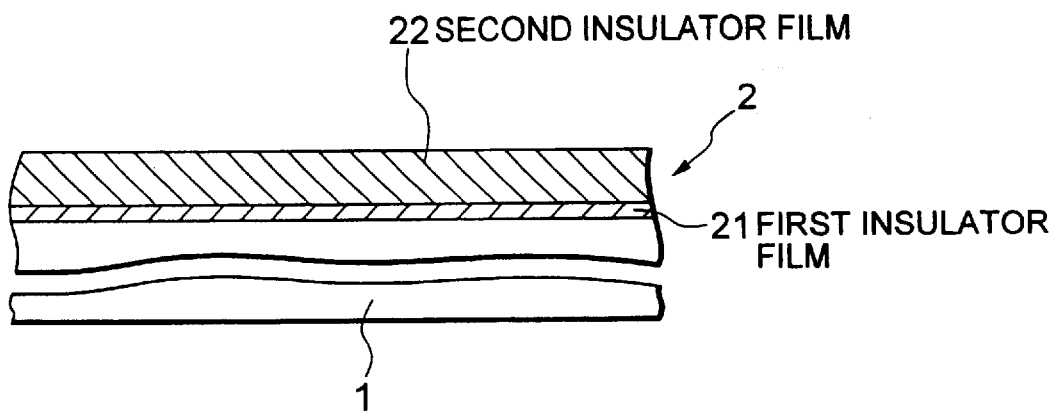

In FIG. 1A, reference numerals 1, 11, 2 and 13 denote a silicon substrate, a field oxide film, a gate insulator and a gate electrode, respectively. The present invention is characterized in a gate insulator 2. The gate insulator 2, as shown in FIG. 1B, is constituted of a first insulator film 21 of a thickness of for instance approximately 1 nm and a second film 22 having a thickness of for instance approximately 3 nm. The first insulator film 21 is an insulator film of high quality formed at the interface with a silicon substrate. The second film 22 is formed on an upper surface of the first insulator film 21

In this instance, a first film 21 of high quality is a first silicon oxynitride film (hereinafter refers to as "SiON film") that is formed by implementing direct oxidizing, nitriding, or oxy-nitriding with plasma on a surface of an object to be processed. Here, microwaves are irradiated, in an atmosphere of processing gas, on the object consisting mainly of silicon, through a planar-array antenna member having a plurality of slits to generate plasma containing oxygen, or nitrogen, or oxygen and nitrogen.

A second film 22 of which deposition rate is larger than that of the first film 21 is formed by forming a second insulator film on the first insulator film.

Next, how to form such a gate insulator 2 will be explained.

Figure 2:
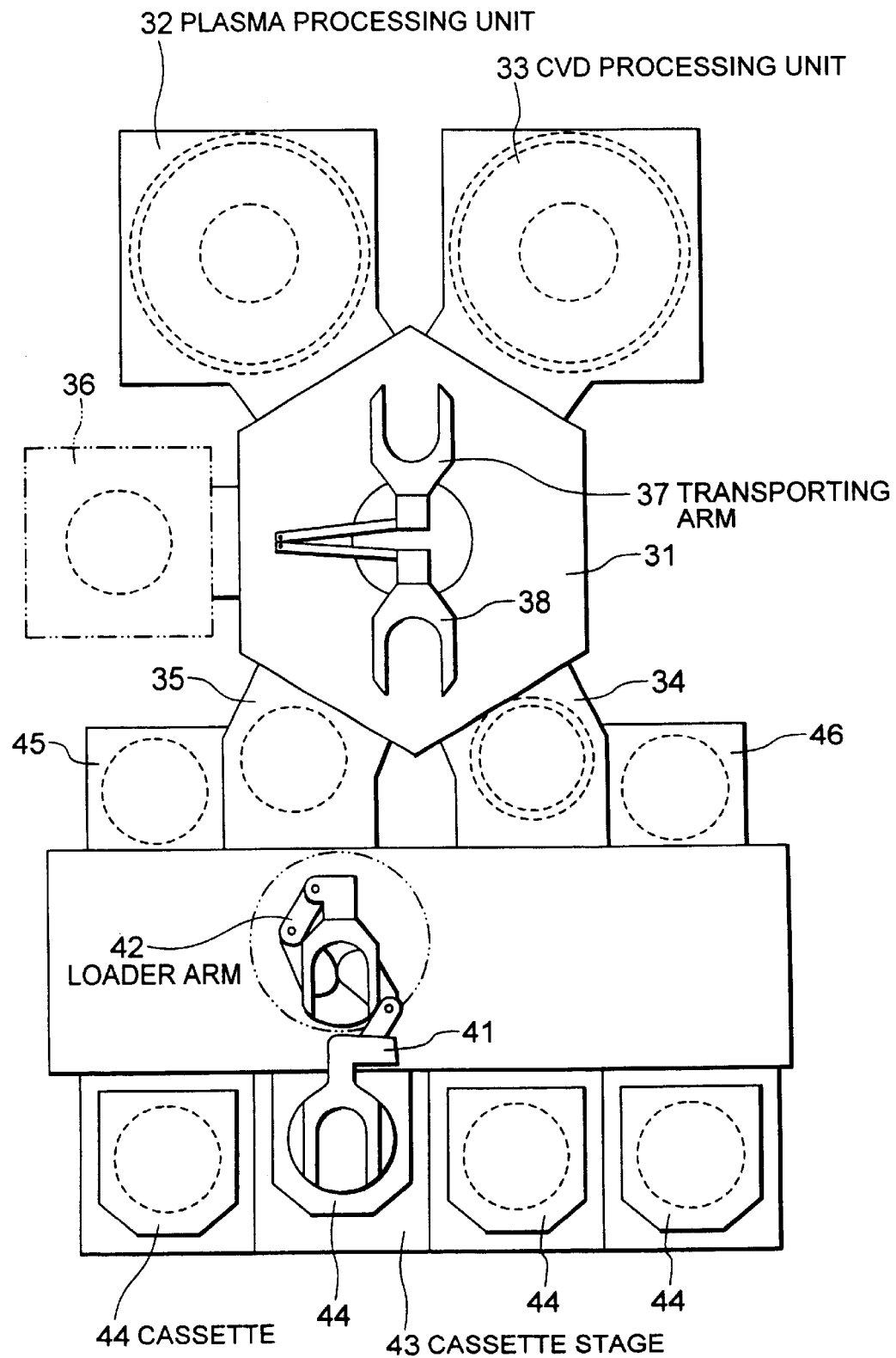
FIG. 2 is a schematic-diagram showing a manufacturing apparatus of semiconductors where a manufacturing method of semiconductors of the present invention is implemented.

FIG. 2 is a schematic diagram showing an entire configuration of a manufacturing apparatus 30 of semiconductors with which a manufacturing method of semiconductors of the present invention is implemented.

As shown in FIG. 2, at an approximate center of the manufacturing apparatus 30, a transportation chamber 31 is disposed. In addition, so as to surround the circumference of the transportation chamber 31, a plasma processing unit 32, a CVD processing unit 33, two load lock units 34 and 35 and a heating unit 36 are disposed.

Beside the load lock units 34 and 35, a preparatory cooling unit 45 and a cooling unit 46 are disposed, respectively.

Inside of the transportation chamber 31, transporting arms 37 and 38 are disposed, with these arms 37 and 38 wafers being transported from and to each of the aforementioned respective units 32 through 36.

At this side of the load lock units 34 and 35 in the figure, loader arms 41 and 42 are disposed. These loader arms 41 and 42 get in and out wafers to and from four cassettes disposed on a cassette stage 43 disposed at the further this side in the figure.

The CVD processing unit 33 in FIG. 2 can be replaced by a plasma processing unit that is identical with the plasma processing unit 32, two plasma processing units being able to set.

Further, both of these units for plasma processing 32 and CVD processing 33 can be replaced by a single chamber unit for plasma enhanced CVD processing. In the place of the plasma processing unit 32 or the CVD processing unit 33, one or two single chamber plasma enhanced CVD processing units can be set. When plasma processing being implemented with two units, after SiON film is directly formed in the processing unit 32, a method for carrying out CVD to deposit a plasma SiN film may be implemented at the processing unit 33. Instead, two processing units 32 and 33 can be operated in parallel to directly form SiON film and to form SiN-CVD film. Or, the processing units 32 and 33 can be operated in parallel to directly form SiON film, thereafter SiN-CVD film being formed with a separate unit.

Figure 3:
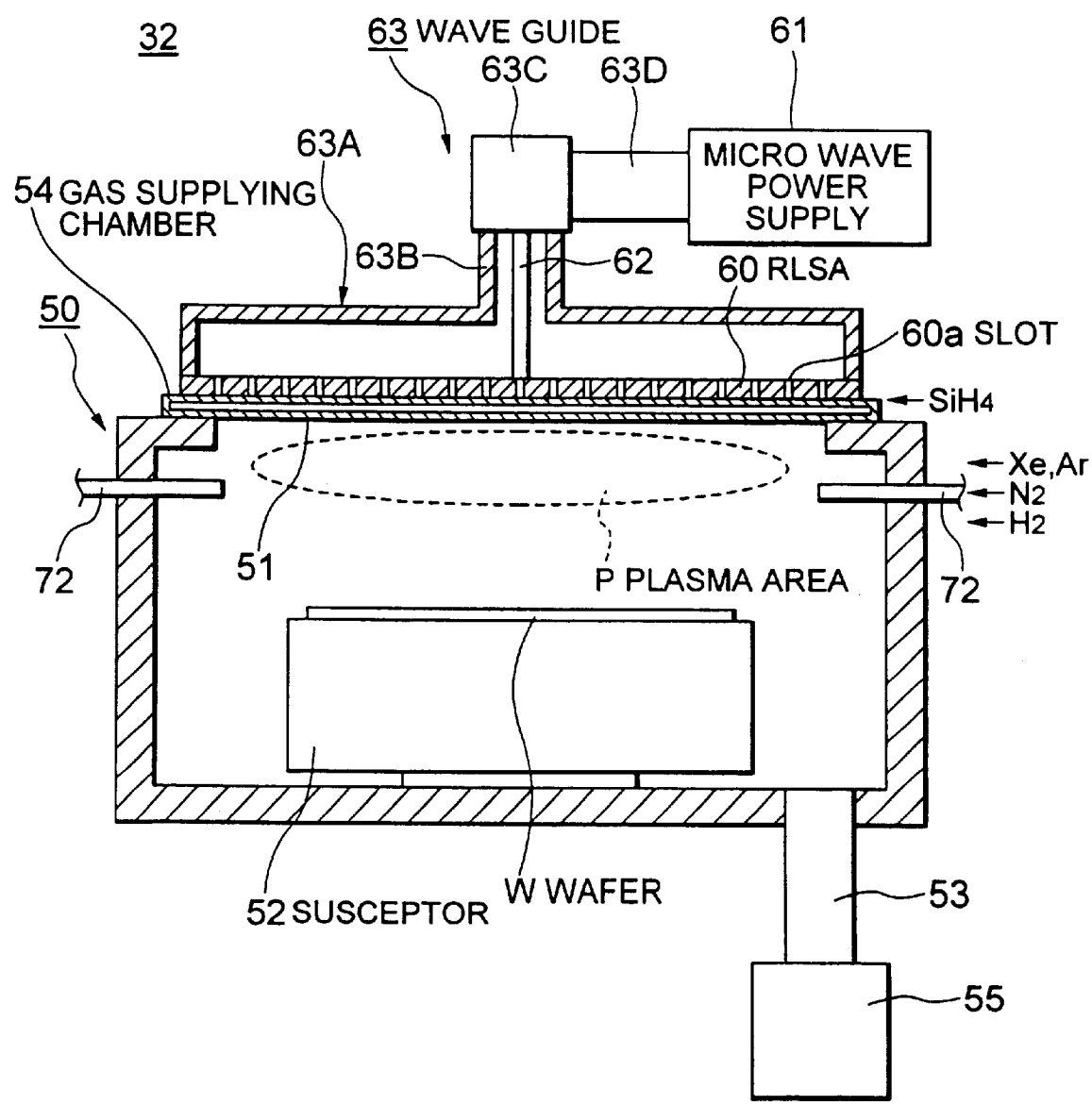
FIG. 3 is a vertical sectional view of a RLSA plasma processing unit used in the present manufacturing method.

FIG. 3 is a vertical sectional view of a unit for plasma processing 32 being used for deposition of gate insulator 2.

Reference numeral 50 denotes a vacuum chamber composed of for instance aluminum. On an upper surface of the vacuum chamber 50, an opening 51 larger than a substrate such as a wafer W is formed, a flat cylindrical gas supplying chamber 54 constituted of dielectrics such as silicon nitride being disposed so as to clog the opening 51. At the lower surface of the gas supplying chamber 54, a lot of gas supplying holes 55 are disposed, gas introduced into the gas supplying chamber 54 being supplied in shower into the vacuum chamber 50 through the gas supplying holes 55.

Outside of the gas supplying chamber 54, through a radial line slot antenna (hereinafter refers to as "RLSA") 60 composed of for instance copper plate, a waveguide 63 is disposed, the waveguide 63 constituting a high frequency power supply portion and being connected to a microwave power supply 61 that generates for instance a microwave of 2.45 GHz. A flat and circular waveguide 63A, a cylindrical waveguide 63B, a coaxial waveguide converter 63C and a square waveguide 63D are combined to constitute the waveguide 63. The flat and circular waveguide 63A is connected to a lower rim of the RLSA 60. One end of the cylindrical waveguide 63B is econnected to an upper surface of the circular waveguide 63A. The coaxial waveguide converter 63C is connected to an upper surface of the cylindrical waveguide 63B. The square waveguide 63D of which one end is perpendicularly connected to a side surface of the coaxial waveguide converter 63C and the other end thereof is connected to the microwave power supply 61.

In the present invention, a high frequency region includes UHF and microwaves. High frequency power supplied from the high frequency power supply is in the range of 300 MHz or more and 2500 MHz or less including UHF of 300 MHz or more and microwaves of 1 GHz or more. Plasma being generated by these high frequency powers is called high frequency plasma, here. Inside of the cylindrical wave guide 63B, one end of an axis 62 consisting of conductive material is connected to an approximate center of an upper surface of the RLSA 60 and the other end is coaxially disposed to connect to an upper surface of the cylindrical waveguide 63B. Thereby the waveguide 63B is constituted to be a coaxial waveguide.

On a sidewall of an upper side of the vacuum chamber 50, at sixteen positions equally disposed along for instance a circumference direction thereof, gas supplying pipes 72 are disposed. From the gas supplying pipes 72, gas including rare gas and N is uniformly supplied in the neighborhood of a plasma area P of the vacuum chamber 50.

In the vacuum chamber 50, facing the gas supplying chamber 54, a susceptor 52 of a wafer W is disposed. The susceptor 52 has a built-in temperature regulator that is not shown in the figure, thereby the susceptor 52 functioning as a heat plate. In addition, to the bottom surface of the vacuum chamber 50, one end of an exhaust pipe 53 is connected, the other end of the exhaust pipe 53 being connected to a vacuum pump 55.

Figure 4:
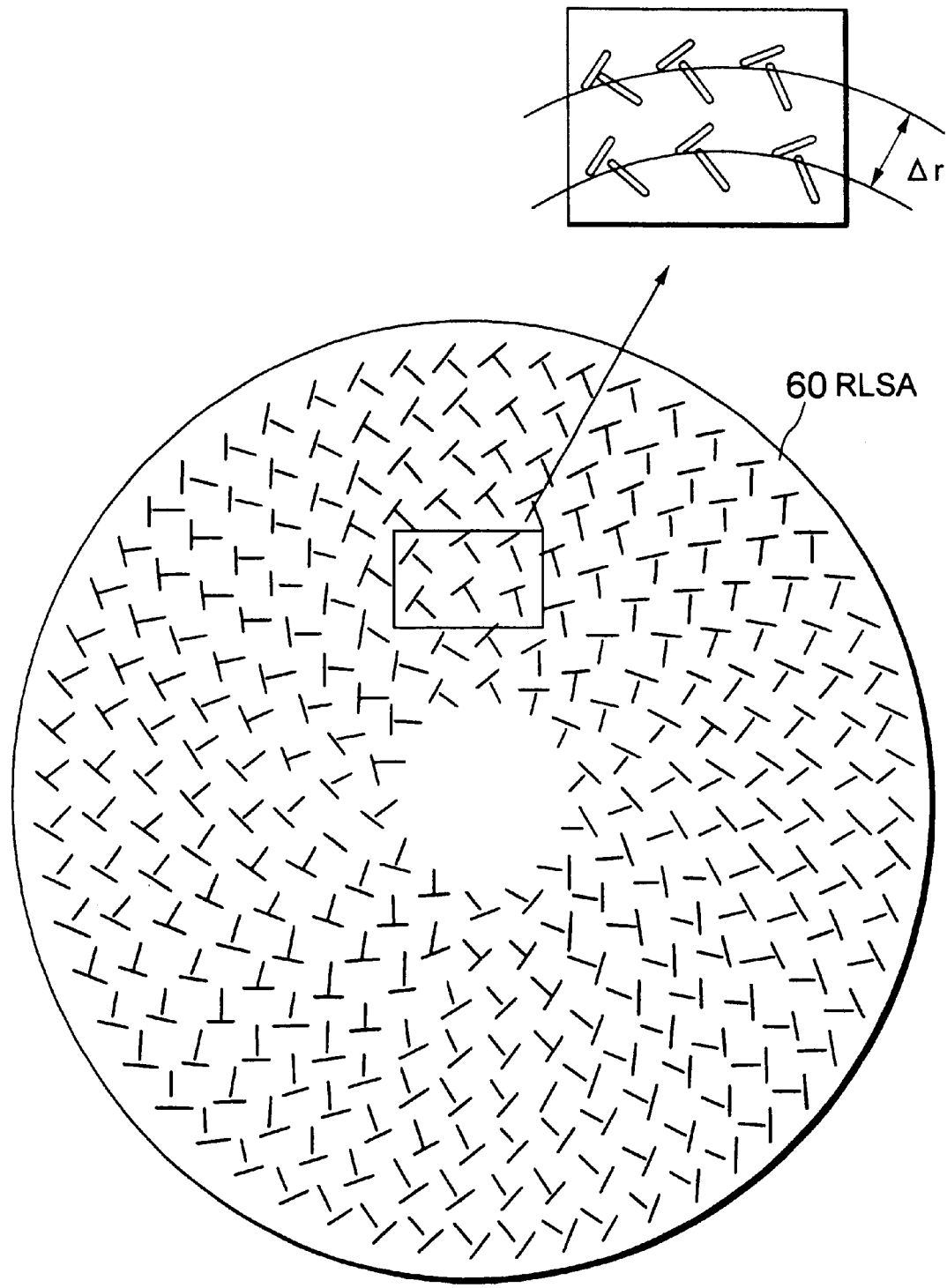
FIG. 4 is a plan view of a RLSA used in a manufacturing apparatus of semiconductors of the present invention.

FIG. 4 is a plan view of a RLSA 60 being used in a manufacturing apparatus of semiconductors of the present invention.

Figure 5:
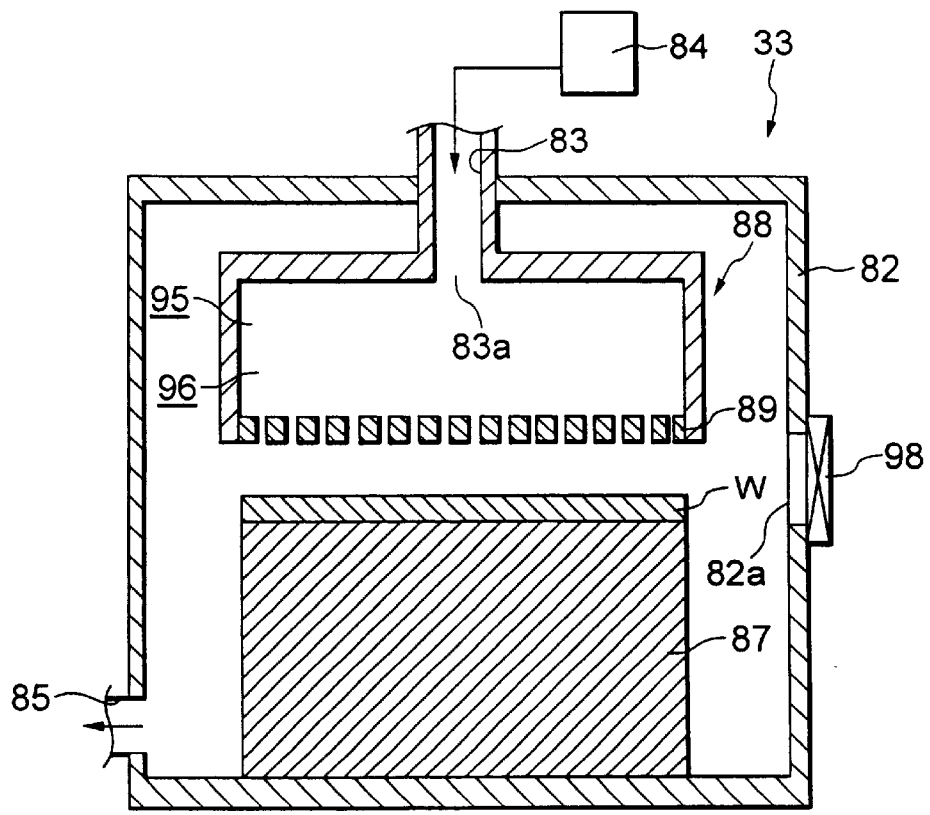
FIG. 5 is a diagrammatic vertical sectional view of a CVD processing unit that is used in the present manufacturing method.

As shown in FIG. 4, the RLSA 60 has a plurality of slots 60a, 60a, - - - on the surface thereof disposed concentrically. Each slot 60a is a penetrated groove of approximate rectangle, the respective adjacent slots being disposed orthogonal to each other in form an approximate alphabetical "T" character. The length and spacing of the slots 60a are determined according to wavelength of microwaves generated by the microwave power supply 61. FIG. 5 is a vertical sectional view showing diagrammatically a CVD processing unit 33 being used in the present manufacturing.

As shown in FIG. 5, a processing chamber 82 of a CVD processing unit 33 is constituted in an air-tight structure of for instance aluminum or the like. Though omitted in FIG. 5, in a processing chamber 82 there are provided with a heating unit and a cooling unit.

In the processing chamber 82, at the upper center thereof, a gas supplying tube 83 is connected to introduce gas, the inside of the processing chamber 82 being communicated with that of the gas supplying tube 83. The gas supplying tube 83 is connected to a gas supply 84. Gas is supplied from the gas supply 84 to the gas supplying tube 83 and the gas is introduced into a processing chamber 82 through the gas supplying tube 83. For this gas, various kinds of gases that can be raw material of thin film can be used, and as demands arise, inert gas can be used as a carrier gas.

At the lower portion of the processing chamber 82, an exhaust pipe 85 for exhausting gas in the processing chamber 82 is connected, the exhaust pipe 85 being connected to an exhausting means consisting of a vacuum pump or the like that is not shown in the figure. By this exhausting means, gas in the processing chamber 82 is evacuated from the gas exhaust pipe 85 to set the inside of the processing chamber 82 at a desired pressure.

In addition, at the lower portion of the processing chamber 82, a susceptor 87 for disposing a wafer W thereon is disposed.

In the present mode of implementation, with an electrostatic chuck of identical diameter with the wafer W but not shown in the figure, the wafer W is disposed on the susceptor 87. The susceptor 87 has a built-in heating means that is not shown in the figure, a surface to be processed of the wafer W that is disposed on the susceptor 87 being regulated to a desired temperature.

The size of the susceptor 87 is one that can accept a wafer W of such large size as 300 mm. As demands arise, the wafer W placed on the susceptor 87 can be rotated.

By having a susceptor 87 such large built-in, a wafer W of a large diameter of 300 mm can be processed, resulting in high yield and less expensive cost ensuing therefrom.

In FIG. 5, on a sidewall of the processing chamber 82 at the right side of the susceptor 87, an opening 82a for getting in and out a wafer W is disposed. The opening 82a is opened and closed by moving a gate valve 98 up and down in the figure. In FIG. 5, at the further right side of the gate valve 98, an arm for transporting a wafer W (not shown in the figure) is disposed adjacently. The transporting arm goes in and out the processing chamber 82 through the opening 82a to dispose the wafer W on the susceptor 87 or take out the processed wafer W out of the processing chamber 82. Above the susceptor 87, a shower head 88 is disposed to shower. The shower head 88 separates a space between the susceptor 87 and the gas supplying tube 83 and is made of for instance aluminum or the like.

The shower head 88 is structured for a gas outlet 83a of the gas supplying tube 83 to locate at the upper center thereof, gas supplied into the processing chamber 82 as it is being introduced into the shower head 88 disposed inside of the processing chamber 82.

Next, how to form an insulator film consisting of a gate insulator 2 on a wafer W with the above apparatus will be explained.

Figure 6:
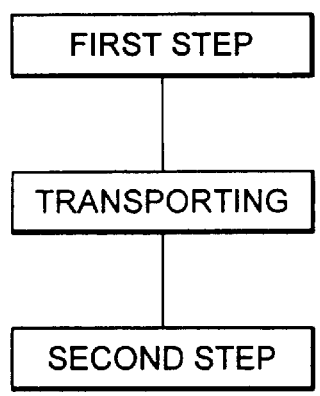
FIG. 6 is a diagram showing a flow chart of a process for forming gate insulator in the method of the present invention.

FIG. 6 is a flow chart showing a flow of the respective steps of the present method.

First, in the preceding step, a field oxide film 11 is formed on a surface of the wafer W.

Then, a gate valve (not shown in the figure) disposed on a sidewall of a vacuum chamber 50 is opened to dispose the wafer W on the susceptor 52 with transporting arms 37 and 38. The wafer W is the silicon substrate 1 on the surface thereof the field oxide film 11 is formed.

Subsequently, after the gate valve is closed to seal the inside, by use of a vacuum pump 55, an inner atmosphere is evacuated through an exhaust pipe 53 to be a prescribed degree of vacuum and maintained at the prescribed pressure. On the other hand, with a microwave power supply 56, microwaves of for instance 2.45 GHz (3 kW) are generated. The microwaves are guided by a waveguide 51 through a RLSA 60 and a gas supplying chamber 54 into the vacuum chamber 50, thereby in a plasma area P at the upper side of the inside of the vacuum chamber 50 high frequency plasma being generated.

Here, the microwaves propagate in a square waveguide 63D in square mode, being converted from the square mode to a circular mode at a coaxial waveguide converter 63C, propagating in the circular coaxial waveguide 63B in circular mode, further propagating in a state expanded at the circular waveguide 63A, being radiated from slots 60a of the RLSA 60, going through the gas supplying chamber 54 to be led into the vacuum chamber 50. At this time, due to use of the microwaves, higher density plasma is generated, and due to radiation of the microwaves from a lot of slots 60*a* of the RLSA 60, the plasma becomes denser.

Then, while regulating the temperature of the susceptor 52 to heat the wafer W at for instance 400° C., Xe gas, $N_2$ gas, $H_2$ gas and $O_2$ gas that are a first gas are introduced from a gas supplying tube 72 with the flow rates of 500 sccm, 25 sccm, 15 sccm and 1.0 sccm, respectively, to implement a first step.

Figure 7A:
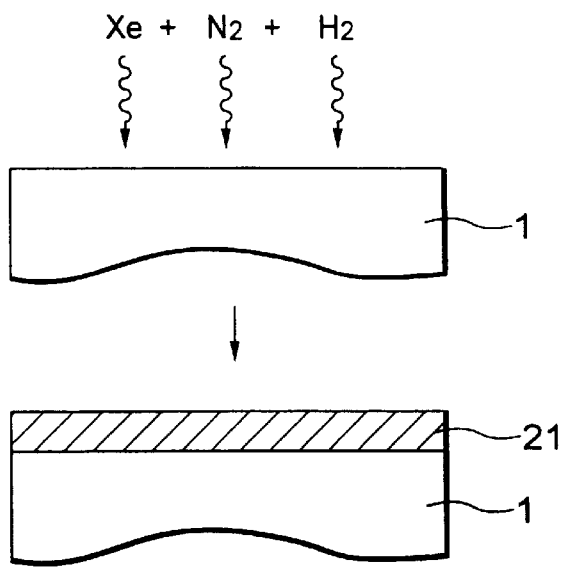
FIG. 7 is a diagram showing the details of formation of gate insulator due to the present method.

In this step, the introduced gas is activated (being converted into plasma) by plasma flow generated at the vacuum chamber 3. With the plasma, as shown in FIG. 7A, a surface of the silicon substrate 1 is converted to oxynitride to form a first insulator film (SiON film) 21. Thus, processing of nitriding is implemented for 30 sec for instance to form the first insulator film (SiON film) 21 of a thickness of 1 nm.

Next, the gate valve is opened to proceed the transporting arms 37 and 38 into the vacuum chamber 50 to receive a wafer W on the susceptor 52. The transporting arms 37 and 38, after taking out the wafer W from the plasma processing unit 32, set it on the susceptor 87 in the adjacent CVD processing unit 33.

Next, in the CVD processing unit 33, the wafer W is exposed to CVD processing, thereby a second insulator film being formed on the previously formed first insulator film.

That is, in the vacuum chamber 3, under conditions of a wafer temperature of for instance 400° C. and a processing pressure of for instance from 50 mTorr to 1 Torr, the second gas is introduced into the chamber 82 to implement the second step.

In specific, from the gas supply 84, a gas containing Si such as $SiH_4$ gas is introduced at a flow rate of for instance 15 sccm. At the same time, from the gas supplying tube 83, Xe gas and $N_2$ gas are introduced at the flow rates of 500 sccm and 20 sccm, respectively.

Figure 7B:
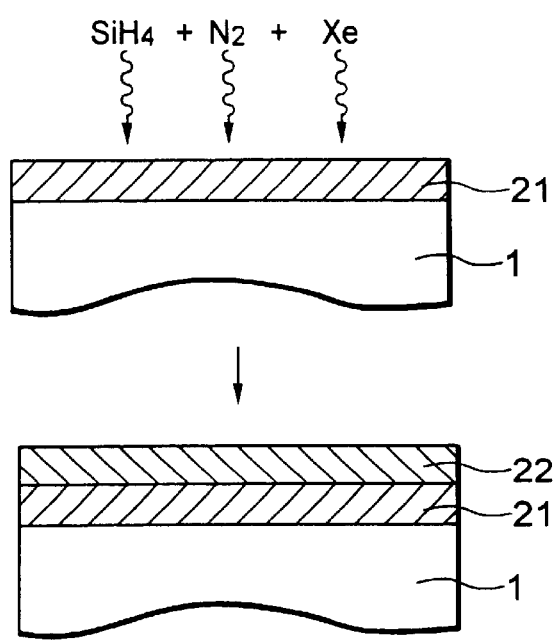

In this step, the introduced second gas is deposited on the wafer W to increase film thickness in a relatively short time. Thus, as shown in FIG. 7B, on the surface of the first insulator film (SiON film) 21, the second insulator film (SiN film) 22 is formed. The SiN film 22, being formed at the deposition rate of for instance 4 nm/min, is processed for 30 sec for instance to form the second insulator film (SiN film) 22 of a thickness of 2 nm. Thus, in the course of total 30 sec processing, a gate insulator 2 of a thickness of 4 nm is formed.

In the aforementioned first step, in depositing the first insulator film, in an atmosphere of the processing gas, on the wafer W consisting mainly of silicon, microwaves are irradiated through a planar-array antenna (RLSA) having a plurality of slits. Thereby, plasma containing oxygen, or nitrogen, or oxygen and nitrogen is formed. With this plasma, direct oxidizing, nitriding, or oxy-nitriding is implemented on the surface of the object to be processed, resulting in high quality and successful regulation of film quality.

That is, quality of the first insulator film is such high as shown in FIG. 8.

As shown in FIG. 8, according to the manufacturing method of semiconductors of the present invention, low level interface states identical with those of thermal oxide film can be secured, and insulation resistance of the gate insulator and alloy spike of boron in the gate electrode can be reduced.

By contrast, in the SiN films due to direct nitriding and CVD method, the interface states increases compared with the thermal oxide film. In this case, carriers disperse largely at the interface to lower a drive current of a transistor.

The reason why the first insulator film formed due to the above method is high in quality is considered as follows.

That is, in the present manufacturing method, at the interface with a silicon substrate, both of nitrogen atoms and oxygen atoms efficiently terminates bonding of silicon atoms to cause less dangling bonds. In addition, as to the insulation resistance and alloy spike of the gate insulator, the CVD-SiN film works effectively. As a result of this, in the present manufacturing method, advantages of the direct oxynitride SiON film and the CVD-SiN film can be successfully extracted.

On the contrary, in forming the interface with SiN alone, it is considered that termination of the dangling bonds are incomplete to result in an increase of the interface states.

By implementing the above second step, the second insulator film formed on the first insulator film can be deposited in a short time. As a result of this, an entire insulator film 2 can be formed in such a short time as shown in the following.

For instance, when the first insulator film SiON is formed with RLSA plasma under conditions of a pressure of 100 mTorr, gas flow rates of Xe, $N_2$, $H_2$ and $O_2$ of 500 sccm, 25 sccm, 15 sccm and 1 sccm, respectively, and a temperature of 400° C., as shown in FIG. 9, a SiON film of a thickness of 1 nm can be deposited in approximately 30 sec.

However, it takes 245 sec to deposit SiON film of a thickness of 3 nm under the same condition. The flow rate of $O_2$ of zero hardly affects the deposit rate. On the other hand, the CVD under conditions of respective flow rates of Xe, $SiH_4$ and $N_2$ gas of 500 sccm, 15 sccm and 20 sccm, and a temperature of 400° C. accomplished the deposition rate of approximately 4.5 nm/min. Accordingly, a film thickness of 2 nm is deposited within approximately 30 sec. As a result of this, in the present manufacturing method, within a total time of approximate 60 sec, an insulator film of a thickness of 3 nm can be deposited to result in remarkable improvement in the deposition rate compared with the direct nitride method.

Figure 10:
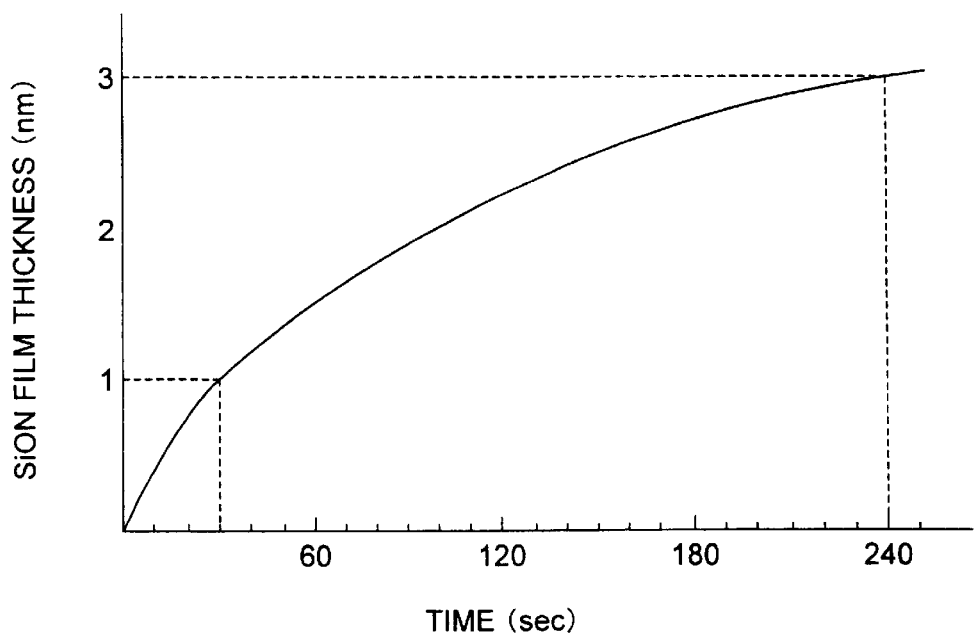
FIG. 10 is a diagram showing relationship between deposition time and film thickness in the present manufacturing method.
Figure 11:
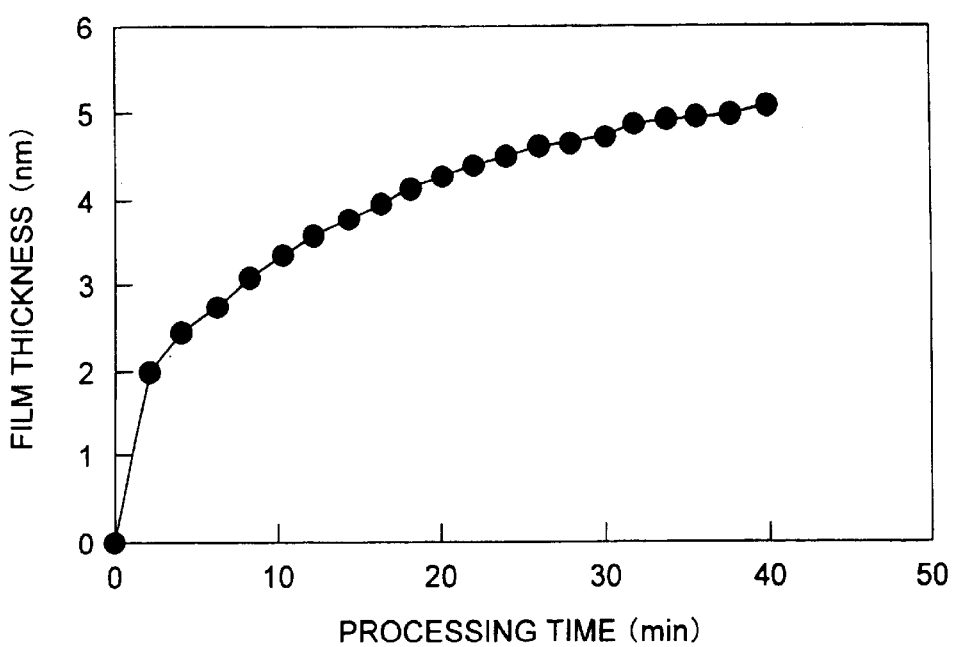
FIG. 11 is a characteristic diagram showing relationship between processing time and film thickness.

Further, variation of film thickness due to direct oxy-nitride deposition with the above RLSA plasma, as shown in FIG. 10, is in proportion to time up to approximately 1 nm to reveal that a surface reaction is the rate-determining step.

However, when exceeding this value, diffusion becomes rate-determining step to gradually slow the deposition rate. Acordingly, in the present manufacturing method, SiON film of a thickness of 1 nm is formed by direct oxy-nitriding and thereafter SiN film is deposited by use of CVD method.

(Embodiment)

In the following, embodiment will be shown.

According to the present manufacturing method of semiconductors, on an n type silicon substrate in which device isolation is implemented, with an apparatus as shown in FIG. 2, with RLSA plasma, at a processing unit 32 shown in FIG. 2, a SiON film of 2 nm thickness is deposited. The total thickness of the insulator film is 3 nm (in terms of oxide film thickness). The SiON film is deposited under conditions of the flow rates of $Xe/N_2/H_2/O_2$=500 sccm/25 sccm/15 sccm/1 sccm, a pressure of 100 mTorr, microwave output power of 2.0 kW, and a temperature of 400° C.

The CVD deposition is carried out under the conditions of the flow rates of $Xe/SiH_4/N_2$=500 sccm/15 sccm/20 sccm, a pressure of 100 mTorr, microwave power of 25 kW and a temperature of 400° C. The deposition time is 62 sec. Under these conditions, throughput of 40 pieces/hour is attained and practical applicability can be confirmed.

The uniformity of the film thickness also is excellent such as 3% in terms of 3σ.

Subsequently to the deposition of the gate insulator, p-type polycrystalline Si gate is formed to evaluate a gate leakage current and interface states. As the result of this, under an input electric field of 75 mV/cm, such excellent results as the gate leakage current of $1.3 \times 10^{-6}$ A/cm$^2$ and the interface states of $6.5 \times 10^{10}$/cm$^2$/eV can be obtained. Further, upon forming a p-MOSFET (L/W=0.25/10 μm) to measure an on state current, the value identical with or more than that of the oxide film ($5.5 \times 10^{-4}$ A/μm) can be obtained.

As shown in the above, according to the present method, excellent gate insulators of a thickness of approximately 3 nm can be formed with the deposition rate compatible sufficiently with industrial applicability.

According to the present invention, in an atmosphere of a processing gas, on an object to be processed consisting mainly of silicon, through a planar-array antenna having a plurality of slits, microwaves are irradiated. That is, by use of the method that uses so-called RLSA antenna, plasma is directly supplied on a silicon substrate to deposit SiN insulator films. Accordingly, the film quality at the interface between the silicon substrate and the SiN insulator film formed on the surface thereof can be successfully regulated.

In addition, according to another manufacturing method of the present invention, by use of the so-called RLSA antenna, a first insulator film is deposited, thereon a second insulator film is deposited to result in a SiN film of excellent quality. In particular,. when the second insulator film is deposited due to the CVD method, the insulator film can be deposited in a short time. Accordingly, a SiN film of high quality can be formed in a short time.

(A second mode of Implementation of the Invention)

Next, another example of a structure of semiconductor devices produced according to a method of the present invention, with an example of a semiconductor device provided with a gate insulator as an insulator film, will be explained with reference to FIG. 1. In FIG. 1A, reference numeral 1 denotes a silicon substrate, reference numeral 11 a field oxide film, reference numeral 2 a gate insulator and reference numeral 13 a gate electrode. The present invention is characterized in the gate insulator 2. The gate insulator 2, as shown in FIG. 1B, is constituted of a first film 21 of a thickness of for instance approximately 20 angstroms and a second film 22 of a thickness of approximately 20 angstroms. The first film 21 is formed at the interface with the silicon substrate 1 and consisting of an insulator film of excellent electrical property. The second film 22 is formed on an upper surface of the first film 21 and consisting of an insulator film that is larger in deposition rate than that of the first film 21.

In this example, a first gas containing rare gas and nitrogen (N) and hydrogen (H) but not silicon (Si) and containing 50% or more and 99% or less of rare gas is converted into plasma. With this plasma, a surface of the silicon substrate 1 is converted to nitride to form a first silicon nitride film (hereinafter refers to as "SiN film"). Thus, the first film 21 of excellent electrical property results. The second film 22 larger in deposition rate than that of the first film 21 is a second SiN film. The second SiN film is deposited by use of plasma that is obtained by converting a gas containing rare gas and N and Si and containing rare gas of 50% or more and 99% or less to the plasma.

The multi-hole slot electrode 60 is constituted of a circular plate larger than the opening 51 in which lots of slots 60a for transmitting microwaves is concentrically formed. The length and disposition spacing of the slots are determined according to wavelengths of microwaves generated by a microwave power supply 61.

On the sidewall of the upper side of the vacuum chamber 50, for instance at sixteen positions located equidistant apart along the circumference direction thereof, gas supply tubes 72 are disposed. From these gas supply tubes 72, a gas containing rare gas and N is uniformly distributed in the neighborhood of the plasma area P of the vacuum chamber 50.

In the vacuum chamber 50, a susceptor 52 of a wafer W is disposed so as to face the gas supply chamber 54. The susceptor 52 is provided with a built-in temperature regulator, thereby the susceptor 52 being constituted to work as a heat plate. In addition, to the bottom of the vacuum chamber 50 one end of the exhaust tube 53 is connected, the other end of the exhaust tube 53 being connected to a vacuum. pump 55.

Next, how to form an insulator film consisting of a gate insulator 2 on a wafer W with the above apparatus will be explained. First, a gate valve that is disposed on the sidewall of the vacuum chamber 50 and not shown in the figure is opened. Thereafter, with a transporting arm that is not shown in the figure, the wafer W that is for instance a silicon substrate 1 on the surface thereof a field oxide film 11 is formed is disposed on the susceptor 52.

Subsequently, the gate valve is closed to seal the inside thereof, thereafter with the vacuum pump 55 an inner atmosphere is evacuated through an exhaust tube 53 to be a prescribed degree of vacuum and to maintain there. On the other hand, microwaves of for instance 2.45 GHz and 3 kW are generated by a microwave power supply 61. The microwaves are guided by a waveguide 63 through the multi-hole slot electrode 60 and the gas supply chamber 54 into the vacuum chamber 50. Thereby, in the plasma area P at the upper side in the vacuum chamber 50, plasma of high frequency is generated.

Here, the microwaves propagate in a square waveguide 63D in square mode, are converted from the square mode to circular mode at a coaxial waveguide converter 63C, propagate in the circular coaxial waveguide 63B in circular mode, further propagate in a state expanded at the circular waveguide 63A, are radiated from the multi-hole slot 60a of the RLSA 60, and go through the gas supplying chamber 54 to be led into the vacuum chamber 50. At this time, due to use of the microwaves, higher density plasma can be generated, and due to radiation of the microwaves from a lot of slots 60a, the plasma becomes denser.

Then, while regulating the temperature of the susceptor 52 to heat the wafer W at for instance 400° C., Xe gas, N$_2$ gas and H$_2$ gas that are the first gas are introduced from gas supplying tubes 72 at the flow rates of 500 sccm, 25 sccm, and 15 sccm, respectively, to implement the first step. In this step, the introduced gases are activated (being converted into plasma) by plasma flow generated in the vacuum chamber 50, with the plasma, as shown in FIG. 7A, a surface of the silicon substrate 1 being converted to oxynitride to form a first insulator film SiN 21. Thus, this nitriding process is implemented for 2 min for instance to deposit the first SiN film 21 of a thickness of 20 angstroms.

Then, microwaves of for instance 2.45 GHz and 200 W are guided from the microwave power supply 61 to generate plasma in the vacuum chamber 3 and at the same time in a state of a temperature of for instance 400° C. and a pressure of for instance 50 mTorr to 1 Torr, a second gas is led into the vacuum chamber 3 to implement a second step. That is, from the gas supply chamber 54 a gas containing silicon for instance such as SiH$_4$ gas is led at the flow rate of for instance 15 sccm. At the same time, from the gas supply tubes 72, Xe gas, and N$_2$ gas are introduced at the flow rates of 500 sccm and 20 sccm, respectively.

In this step, the second gas that is introduced is converted into plasma by the plasma flow generated at the vacuum chamber 50, therewith as shown in FIG. 7B, a second SiN film 22 is deposited on the first SiN film 21. The SiN film 22 being deposited with the deposition rate of for instance 20 angstroms/min, the deposition process is implemented for instance 1 min to form the second SiN film 22 of a thickness of 20 angstroms. Thus, in a total time of 3 min, a gate insulator 2 of a thickness of 40 angstroms can be formed. In the above first step, in the above process deposition apparatus the plasma of high density is generated. Therewith, a first gas containing rare gas and N and H and not Si and containing 50% or more and 99% or less of rare gas is converted into plasma. Therewith, the surface of the silicon substrate 1 heated at a temperature of for instance 300 to 400° C. is converted into nitride to form a first SiN film 21. Accordingly, the first SiN film 21 of excellent electrical property can be obtained.

The electrical property of the insulator film is determined by the number of defects, and the less the number of defects is, the more preferable the electrical property is. The defect density of the first SiN film 21 formed according to the above method is approximately $7\times10^{10}/cm^2$, which is less than approximately $1\times10^{12}/cm^2$ of that of thermal nitride film. Accordingly, it can be said that electrical property is excellent.

The reason why the electrical property of the first SiN film 21 formed according to the above method is excellent as such is considered as follows. First, the first gas contains rare gas and N and H and not Si, in which due to introduction of the rare gas, defects such as density of interface states are surmised to be suppressed in occurrence. In this case, as obvious from the experiment that will be described later, when the content of rare gas is less than 50%, the number of defects increases. When the content is 100%, the deposition can not be implemented. By contrast, when 99% or less, though becoming smaller in deposition rate, deposition can be implemented without deteriorating the film quality. Accordingly, it is preferable to set at 50% or more and 99% or less. In addition, due to introduction of a gas containing H, the dangling bonds can be decreased to result in suppression of occurrence of defects. Accordingly, electrical property is considered to improve.

Further, when the first gas is converted into plasma by use of the plasma that is called such as ICP (Inductive Coupled Plasma), the number of defects of the obtained SiN film increases. The ICP is generated by supplying an electric field and magnetic field with a coil wound into a dome-like container shape to generate plasma from the first gas. Therefrom, in the above plasma deposition apparatus, by generating the plasma of high density such as mentioned in the above to convert therewith the first gas into plasma, the electrical property is considered to improve.

In the above second step, in the above process deposition apparatus, high density plasma is generated and thereby the plasma of the second gas containing rare gas and N and Si is generated to deposit the second SiN film 22. Accordingly, the second SiN film 22 that is larger in deposition rate than that of the first SiN film 21 can be obtained.

The reason why such a large deposition rate can be attained is due to introduction of a gas containing Si such as silane-based gas such as $SiH_4$. By contrast, the simultaneous introduction of the rare gas is to lower the concentration of silane-based gas to avoid any difficulties in regulation of film thickness due to a too fast deposition rate. Here, concerning the content of an inert gas, when contained too much, the deposition rate becomes smaller, on the contrary when contained too little, the number of defects becomes larger. Accordingly, it is preferable to set at 50% or more and 99% or less.

Further, in the above process, in depositing the second SiN film 22, power of microwaves is lowered down to 200 W that is smaller than that (3 kW) employed for the first SiN film 21. This is due to the following reason. Upon decomposition of $SiH_4$, the generated $H_2$ diffuses outwards to lower the concentration of Si in the outward area relative to that of the center area, resulting in less uniformity of the film thickness of the SiN film 22. In order to prevent this from occurring, the power of microwaves is decreased to suppress excessive decomposition of $SiH_4$.

In addition, in the above process, the first and second steps are implemented in the same plasma deposition apparatus. Accordingly, the first and second steps can be successively implemented to shorten the total deposition time, thereby the throughput being able to improve. Further, the above plasma processing apparatus being low in its electron temperature, by depositing the first SiN film 21 and the second SiN film 22 with this apparatus, the silicon substrate 1 is damaged less.

The second SiN film 22 formed according to the above method has a defect density of approximately $1\times10^{11}/cm^2$ to result in worse electrical properties than that of the first SiN film 21. However, the portion that is necessary to be good in electrical property is the portion where the SiN film contacts the silicon substrate, that is, an entire film is not necessarily required to be electrically excellent. Accordingly, when the second SiN film 22 as such is deposited on the above layer than the interface with the silicon substrate 1, the electrical property of the gate insulator 2 is not adversely affected.

Thus, in the above process, a gate insulator 2 is constituted of a first SiN film 21 of excellent electrical property and a second SiN film 22 of which deposition rate is larger than that of the first SiN film 21. Accordingly, an insulator film of excellent electrical properties can be obtained in a shorter deposition time.

To be specific, as in the above first process for instance, a silicon substrate 1 is processed to nitride with a first gas of Xe gas/$N_2$ gas/$H_2$ gas=500 sccm/25 sccm/15 sccm. Then, as shown in FIG. 4, within the first 2 min, a SiN film of 2 nm (20 angstroms) can be deposited. Thus, in the initial period of the processing, a larger deposition rate can be obtained. However, when the film thickness exceeds 2 nm, the deposition rate becomes smaller to take approximately 20 min to deposit nitride film of 4 nm. On the contrary, as in the process of the second step, when a SiN film is formed by converting the second gas of $SiH_4$ gas/$N_2$ gas/Xe gas=15 sccm/20 sccm/500 sccm into plasma, the deposition rate of 2 nm/min can be attained.

Figure 12:
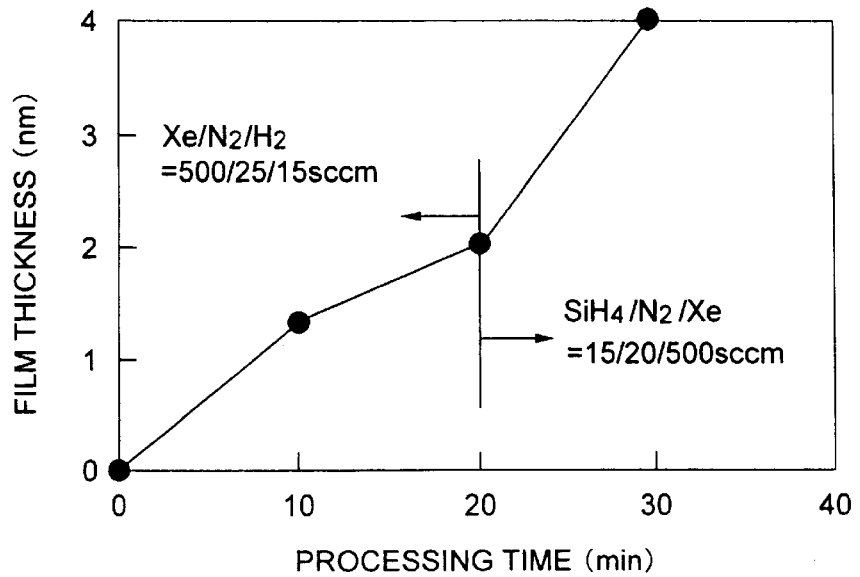
FIG. 12 is a characteristic diagram showing relationship between processing time and film thickness.

Accordingly, when a SiN film of a thickness of 4 nm is necessary, as shown in FIG. 12, first nitriding due to the first gas is carried out for 2 min to form a first SiN film 21 of 2 nm at the interface with a silicon substrate 1. Thereafter, deposition due to the second gas is implemented for 1 min on an upper surface of the first SiN film 22 to form a second SiN film 22 of a thickness of 2 nm. As a result of this, a SiN film of a thickness of 4 nm can be formed in 3 min.

Figure 13:
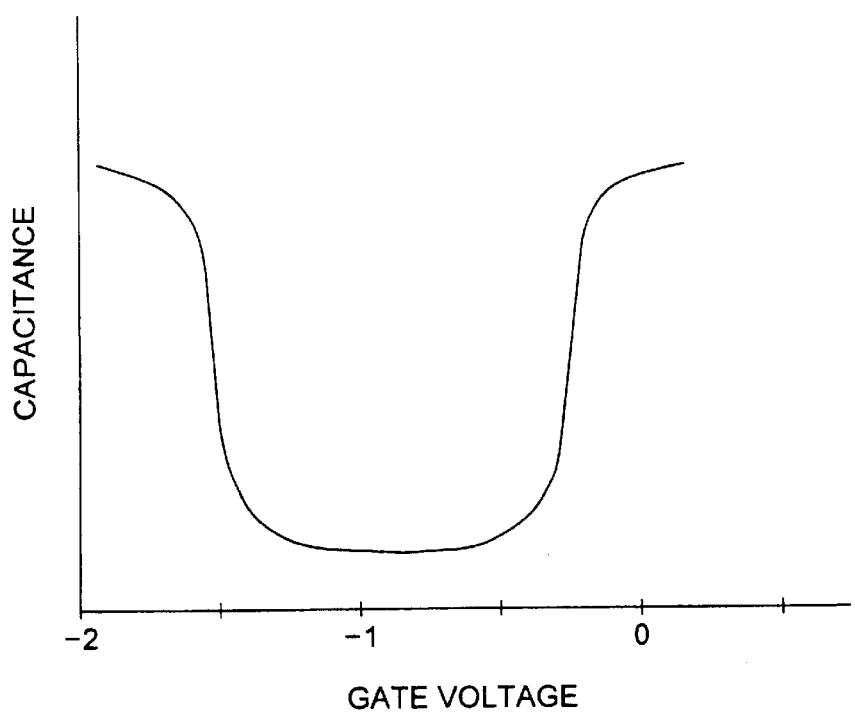
FIG. 13 is a characteristic diagram showing relationship between capacitance and gate voltage.

The gate insulator 2 obtained thus by the above process is measured of capacitance and gate voltage. The electrical property shown in FIG. 13 is obtained. Even in the case of such a thin film thickness as 4 nm, it is confirmed that electrical property identical with that of the existing $SiO_2$ film can be obtained.

Further, in the above plasma deposition apparatus, with, as the first gas, a gas in which Ar gas and $N_2$ gas and $H_2$ gas are mixed with a ratio of 90:7:3 (Ar/$N_2$/$H_2$=450 sccm/35 sccm/15 sccm), under conditions of a wafer temperature of 400° C. and a process pressure of 50 mTorr to 1 Torr, microwave power of 2.45 GHz and 3 kW is introduced from the microwave power supply 51 to implement the first step identical with the above and to deposit a first SiN film 21 of a thickness of 20 angstroms. Then, with, as the second gas, a gas in which $SiH_4$ gas and $N_2$ gas and Ar gas are mixed with a ratio of 3:4:90 ($SiH_4/N_2/Ar$=15 sccm/20 sccm/450 sccm), under conditions of a wafer temperature of 400° C. and a process pressure of 50 mTorr, microwave power of 2.45 GHz and 200 W is guided from the microwave power supply to implement the second step and to deposit a second SiN film 23 of a thickness of 20 angstroms. The total deposition time is 4 min. The electrical property of the obtained insulator film is measured. Even in the case of such a thin film thickness as 40 angstroms, it is confirmed to be electrically excellent and appropriate for a gate insulator.

Subsequently, an example of the experiment that was carried out to optimize a ratio of inert gas in a first gas will be explained. In this experiment, Xe gas and $N_2$ gas and $H_2$ gas are used as the first gas. In the above plasma deposition apparatus, under the conditions of a wafer temperature of 400° C. and a process pressure of 50 mTorr to 1 Torr, from a microwave power supply 51 microwaves of 2.45 GHz and 3 kW is guided to deposit a first SiN film 21 of a thickness of 20 angstroms. At this time, with the ratio of flow rates of $N_2$ gas and $H_2$ gas at 5:2, the content of Xe gas is varied in the range of from 30% and 99% to deposit the first SiN film 21. Thereafter, number of defects is measured by use of CV measurement method. The electrical properties are evaluated according to the numbers. The results are shown in FIG. 14. The electrical properties are evaluated in three grades of ○ (good), ×(bad) and Δ (intermediate).

As the results of this experiment, when Xe gas is contained in the range of from 50% to 99%, the defect density is approximately $7\times10^{10}/cm^2$ and the electrical property is excellent. On the contrary, when the content of Xe gas is 40% or less, it is confirmed that the defect density increases to result in deterioration of the electrical property.

In the above, the rare gas contained in the first gas can be, other than Xe, helium (He), neon (Ne) or krypton (Kr). As the first gas, a gas containing rare gas and $NH_3$ may be used. In addition, as the second gas, a gas containing rare gas and N and Si can be used. Here, as the gas containing Si, other than $SiH_4$, $Si_2H_6$ may be used.

In the above plasma deposition apparatus, an example of employing microwaves of 2.45 GHz is explained. However, in the present invention, UHF of for instance 500 MHz can be used to generate the plasma. In this case, the slots of the multi-hole slot electrode are designed into long holes according to the frequency.

Next, another example of the present invention will be explained. In this example, the first insulator film 21 is composed of $SiO_2$ film. The $SiO_2$ film, for instance in the above plasma deposition apparatus, can be deposited by implementing plasma oxidation on the surface of the silicon substrate 1. The plasma oxidation is implemented with the plasma of the gas containing rare gas and oxygen (O) but not Si and containing the rare gas in the range of 50% and more and 99% or less.

To be specific, as a gas that contains rare gas and O but not Si and contains the rare gas in the range of 50% or more and 99% or less, a gas mixture of Ar gas and $O_2$ gas is used. These gases are introduced at the flow rates of Ar gas/$O_2$ gas=500 sccm/15 sccm and under the conditions of a wafer temperature of 430° C. and a process pressure of 50 mTorr to 1 Torr, from a microwave power supply, microwaves of 2.45 GHz and 3 kW are introduced to convert Ar gas and $O_2$ gas into plasma. With this plasma, a surface of the silicon substrate 1 is oxidized for two min to form a $SiO_2$ film of a thickness of for instance 20 angstroms. On the obtained $SiO_2$ film, with the identical process with the above, the second SiN film 22 is deposited by for instance 20 angstroms to form an insulator film.

In this process, in a total time of 3 min for instance, an insulator film of a thickness of 40 angstroms can be formed. The $SiO_2$ film formed through plasma oxidation of silicon, being such low as $7\times10^{10}/cm^2$ in the defect density thereof, is excellent in electrical property. Here, the content of the inert gas is preferable to be in the range of 50% or more and 99% or less. It is because that when the content becomes smaller than 50%, density of interface states increases.

An insulator film is actually formed by use of the above process and the relationship between capacitance and gate voltage thereof is measured. The results are excellent to confirm being suitable as the gate insulator. It is understood that thereby, even when an insulator film of such a thin total thickness as 40 angstroms is formed with $SiO_2$ film as the first film 21, by depositing a second film 22 on the $SiO_2$ film, a leakage current becomes smaller.

As the gas that contains rare gas and oxygen but not Si, a combination of rare gas and ozone ($O_3$) and a combination of rare gas and water vapor ($H_2O$) may be used.

Next, still another example of the present invention will be explained. In this example, a first film 21 of the insulator film is formed of a $SiO_2$ film formed through thermal oxidation of silicon. The $SiO_2$ film can be formed due to rapid thermal oxidation process for instance in which a silicon wafer is heated to approximately 850° C. and exposed to water vapor atmosphere.

Such a first film 21 is deposited by 20 angstroms in for instance 5 min and thereon with the identical process with the above a second SiN film 22 is formed by for instance 20 angstroms to form an insulator film. Thereby, in a total time of for instance 6 minutes the insulator film of 40 angstroms can be formed. The $SiO_2$ film formed through thermal oxidation of silicon, being less in the defect density such as $5\times10^{10}/cm^2$, is excellent in electrical property. An insulator film is actually formed by the above process and relationship between capacitance and gate voltage is measured. The result is excellent and it is confirmed that the insulator film is suitable for the gate insulator.

Next, still another example of the present invention will be explained. In this example, the first film 21 of the insulator film is formed of silicon oxynitride film, the silicon oxynitride film being deposited by annealing for instance $SiO_2$ film in an atmosphere of NO. To be specific, a silicon wafer having a silicon oxide layer of a thickness of 20 angstroms is heated to a temperature of 850° C. and exposed to NO gas to form a thermal nitride film.

Due to this process, on the surface of the silicon substrate 1, a silicon oxynitride film of a thickness of for instance 20 angstroms is formed in 10 minutes. Thereon, as identical with the above process, a second SiN film 22 of a thickness of for instance 20 angstroms is deposited to form an insulator film of a thickness of 40 angstroms.

In this process, in a total time of for instance 11 minutes, an insulator film can be formed. The silicon oxynitride film thus formed has the defect density of approximately $5\times10^{10}/cm^2$ and is excellent in electrical properties. An insulator film is actually formed by the above process. Upon measuring the relationship between capacitance and gate voltage thereof, it is found that the relationship is excellent and the insulator film is suitable for the gate insulator.

As explained in the above, according to the present invention, an insulator film is formed by depositing a first film of excellent electrical property and a second film of fast deposition rate. Accordingly, an insulator film of excellent electrical property can be formed in a short time.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A manufacturing apparatus comprising:

at least one processing chamber;

an evacuating unit for decompressing said at least one processing chamber to 1 Torr or less;

a microwave power supply;

a planar-array antenna connected to said power supply and disposed in said at least one processing chamber, said antenna having a plurality of slots to generate a plasma;

a temperature raising unit which maintains a temperature of a substrate at 400° C. or above;

a gas supply unit introduces a processing gas into said at least one processing chamber, said processing gas containing oxygen, nitrogen or oxygen and nitrogen; and transporting unit which transports a substrate to be processed in a vacuum, said plasma oxdizing, nitriding or oxy-nitriding directly on a surface of said substrate in said at least one processing chamber to deposit an insulator film of a thickness of 1 nm or less.

2. The manufacturing apparatus of semiconductors as set forth in claim 1:

wherein two of more of said process chambers are disposed so as to deposit gate insulators in parallel.

3. The manufacturing apparatus as set forth in claim 1, further comprising a CVD chamber different from said at least one processing chamber, said CVD chamber, said at least one processing chamber and said vacuum transporting unit cooperating to subject said substrate to direct oxy-nitriding in said at least one processing unit and then SiN deposition in said CVD chamber.

* * * * *